US009360847B2

(12) United States Patent
Feldmann et al.

(10) Patent No.: US 9,360,847 B2
(45) Date of Patent: Jun. 7, 2016

(54) METHOD AND OPERATING UNIT FOR OPERATING MODULES IN AUTOMATION TECHNOLOGY

(75) Inventors: Juergen Feldmann, Blomberg (DE); Thomas Hirsch, Detmold (DE); Simon-Immanuel Gries, Detmold (DE)

(73) Assignee: Phoenix Contact GmbH & Co. KG (DE)

(*) Notice: Subject to any disclaimer, the term of this patent is extended or adjusted under 35 U.S.C. 154(b) by 674 days.

(21) Appl. No.: 13/878,184

(22) PCT Filed: Oct. 6, 2011

(86) PCT No.: PCT/EP2011/004978
§ 371 (c)(1),
(2), (4) Date: Jun. 19, 2013

(87) PCT Pub. No.: WO2012/045453
PCT Pub. Date: Apr. 12, 2012

(65) Prior Publication Data
US 2013/0289746 A1    Oct. 31, 2013

(30) Foreign Application Priority Data

Oct. 7, 2010    (DE) .......................... 10 2010 047 632

(51) Int. Cl.
*G05B 11/01*    (2006.01)
*G05B 19/042*    (2006.01)
*H05K 7/14*    (2006.01)

(52) U.S. Cl.
CPC ............. *G05B 11/012* (2013.01); *G05B 19/042* (2013.01); *H05K 7/1481* (2013.01); *H05K 7/1484* (2013.01); *G05B 2219/23312* (2013.01);

(Continued)

(58) Field of Classification Search
None
See application file for complete search history.

(56) References Cited

U.S. PATENT DOCUMENTS 5,649,001 A * 7/1997 Thomas ................... H04L 29/06
379/93.07
7,657,928 B2 * 2/2010 Shima ................... H04L 12/2805
726/27

(Continued)

FOREIGN PATENT DOCUMENTS

DE    102004030375 A1    1/2006
DE    102004052438 A1    5/2006

(Continued)

OTHER PUBLICATIONS

"German Office Action", issued in related application No. 10 2010 047 632.3, dated Mar. 30, 2011.

(Continued)

*Primary Examiner* — Elias Mamo
(74) *Attorney, Agent, or Firm* — Kaplan Breyer Schwarz & Ottesen LLP

(57) ABSTRACT

For operating a module which is designed as a device in an automation system in particular and has a module-side communication interface, the invention provides an operating unit having fastening means for detachably fastening the operating unit on the module, having input means and output means for input and output of information, having a first communication interface, which is connected to the module-side communication interface when the operating unit is attached and is designed for data exchange between the operating unit and the module as well as having a second communication interface for communication with a separate operating device. The invention also provides a method for operating a module.

11 Claims, 4 Drawing Sheets

(52) U.S. Cl.
CPC .......... *G05B 2219/23406* (2013.01); *G05B 2219/23412* (2013.01)

(56) References Cited

U.S. PATENT DOCUMENTS

| | | | |
|---|---|---|---|
| 2003/0084211 A1 | 5/2003 | Herinckx | |
| 2007/0095902 A1* | 5/2007 | Fukasawa | G06F 21/445 235/382 |
| 2009/0125640 A1* | 5/2009 | Sunwoo | G06F 3/0346 710/3 |
| 2010/0236824 A1 | 9/2010 | Roosli | |
| 2012/0173654 A1* | 7/2012 | Tsao | G06Q 30/02 709/213 |
| 2012/0303854 A1* | 11/2012 | Karslioglu | G06F 13/36 710/306 |
| 2013/0007316 A1* | 1/2013 | Moon | G05B 19/042 710/62 |

FOREIGN PATENT DOCUMENTS

| | | |
|---|---|---|
| DE | 102006028361 A1 | 9/2007 |
| DE | 20200815406 U1 | 5/2009 |
| DE | 102008055660 A1 | 5/2010 |
| DE | 102009011552 A1 | 9/2010 |
| EP | 1513034 A2 | 3/2005 |
| EP | 2182418 A2 | 5/2010 |

OTHER PUBLICATIONS

"Related Korean Application No. 10-2013-7008848 Office Action", Aug. 18, 2014, Publisher: KIPO, Published in: KR.

"Related Russian Application No. 2013-120539/08(030467) Office Action", Aug. 26, 2014, Publisher: Russian Patent Office, Published in: RU.

"International Patent Application No. PCT/EP2011/004978 International Preliminary Report on Patentability", Apr. 18, 2013.

Saba Kues, "International Patent Application No. PCT/EP2011/004978 International Search Report", Feb. 28, 2012, Publisher: PCT, Published in: EP.

"Parent German Patent Application No. DE 10 2010 047 632.3", "Office Action", Jan. 30, 2015, Published in: DE.

"Korean Patent Application No. KR 10-2013-7008848", "Office Action", Feb. 25, 2015, Publisher: KIPO, Published in: KR.

* cited by examiner

METHOD AND OPERATING UNIT FOR OPERATING MODULES IN AUTOMATION TECHNOLOGY

FIELD OF THE INVENTION

The invention relates to a method and a device for operating a module designed in particular as a device in an automation system having a module-side communication interface.

BACKGROUND OF THE INVENTION

A variety of different modules are used in industrial automation technology, e.g., for measurement and feedback control technology. Operating units for such modules are typically developed for a certain module or for a limited group of modules, i.e., the menu structure and menu functionality of an operating application belonging to the respective module will be stored permanently in the respective operating units.

Use of the operating unit for modules to be developed in the future is thus impossible and instead a new operating unit must be developed in each case, which results in a high development effort.

Modules of measurement and feedback control technology that are used in industrial automation technology may comprise, for example, sensors, actuators, monitoring modules, measurement transformers or other different modules of a plurality of different modules. For configuring and/or parameterization of a module, it will typically have a communication interface which leads to the outside and to which a removable operating unit or a personal computer (PC) may optionally be connected. If the module is to be accessed from the PC, the operating unit must be removed from the module to be able to connect the PC to the communication interface, but this is a disadvantage.

SUMMARY OF THE INVENTION

An object of the present invention is therefore to provide a new and/or improved method of operating a module, which is designed in particular as a device in an automation system having a module-side communication interface.

Accordingly, the invention provides for an operating unit for operating a module having a module-side communication interface, having fastening means for detachable fastening of the operating unit on the module and having input and output means for input and output of information. Furthermore, the operating unit has a first communication interface and a second communication interface, such that the first communication interface is connected to the module-side communication interface when the operating unit is attached and is designed for data exchange between the operating unit and the module, and such that the second communication interface serves to communicate with a separate operating device.

The module is in particular a device for an automation system, such that the module is advantageously designed as a device of the measurement, control and regulation technology or as a converter for the measurement, control and regulation technology. Accordingly, operation of the module advantageously includes the display and/or change in parameterization data and/or configuration data and/or the display of process values.

A converter for the measurement, control and regulation technology serves in particular to prevent the falsification of analog signals due to external disturbances because the transmission of analog signals in industrial environments is particularly subject to interference. Through accurate conversion, separation or adaptation of analog signals, a converter secures and increases the transmission quality and therefore the quality of the control circuits.

Accordingly, the module may be designed as a signal separator, for example, for electrical isolation, amplification, filtering and/or matching of analog signals, as a measuring transducer for converting signal quantities or as a monitoring module for detecting analog signals and for controlling and monitoring a function depending on the signal value.

A basic idea of the present invention is to create a possibility for connecting a computer to the module by means of the second communication interface on the operating unit, even if there is already an operating unit connected to the module and accordingly the first communication interface of the operating unit is connected to the module-side communication interface.

Accordingly, the operating unit is advantageously designed for control of a communication between a module connected to the first communication interface and a separate operating device that is connected to the second communication interface, such that the separate operating device is a PC in particular, which may be designed as a laptop or as a tablet PC, for example.

To this end, in an advantageous embodiment, it is provided that a first address is assigned to the module-side communication interface of the connected module, and a second address, which is different from the first address, is assigned to the second communication interface of the operating unit. In this embodiment, the operating unit is designed to forward to the module the data telegrams, which are received by the separate operating device and include the first address, and to forward the response by the module to the separate operating device. The operating unit preferably comprises a master protocol stack for communication with the module and a slave protocol stack for communication with the separate operating device.

Another basic idea of the invention is that the operating unit supports different modules, in particular including future modules. This is achieved by the fact that the microcontroller that is used with the operating unit can program itself during run time. When a module of a different type is connected to the operating unit, the operating unit loads the respective menu structure and functionality belonging to the module in the form of an application part out of the module in an especially advantageous manner and thus replaces a portion of its own memory, so that a flash memory is expediently used as the memory and the application part is loaded in the form of executable hex code.

Accordingly, the fastening means are preferably designed for fastening the operating unit onto modules of different module types. Furthermore, the operating unit is advantageously designed to receive and to store identification information, which identifies a type of module from a module connected to the first communication interface.

In an especially preferred embodiment, the operating unit comprises at least one memory for storing an operating application, such that the memory comprises a first memory area for storing a first application part and a second memory area for storing a second application part, such that access between the application parts is preferably controlled via a predetermined software interface of the operating unit. The second application part is essentially the module-specific application part, which is loaded from an attached module.

The operating application especially advantageously provides an operating interface comprising a graphical user interface by means of which a menu for selection of executable functions is displayed for the user. The module-specific menu area, comprising the module-specific menu structure and the module-specific functions, is supplied by the second application part.

The operating unit is preferably designed to receive the identification information from the connected module before downloading the second application part and to compare it with the identification information stored most recently, and only if the received identification information is different from that saved most recently is the second application part to be loaded from the connected module and the received identification to be saved. In this way, a second application part is loaded from the module only if/when necessary.

A RAM memory and/or a flash memory is/are preferably provided as the memory, such that the first and second memory areas both preferably consist of a RAM memory and a flash memory.

In a preferred embodiment, the first and second communication interfaces of the operating unit are designed for serial data transmission.

The method according to the invention for operating a module designed in particular as a device for an automation system having a module-side communication interface provides for an operating unit to be attached to the module as described above, so that the first communication interface of the operating unit is connected to the module-side communication interface and provides for a user interface to be supplied by means of an operating application stored in a memory of the operating unit.

This method advantageously comprises the method of transmitting identification information which identifies a type of module from the module to the operating unit and comparison by the operating unit of the received identification information with identification information stored at a predetermined location in the memory of the operating unit. If the received identification information differs from the stored identification information, then the operating unit loads the second application part from the module, and stores the downloaded second application part in a second memory area of the operating unit, such that the second application part and a first application part stored in a first memory area of the operating unit from the operating application, and the received identification information is stored at the predetermined memory location in the operating unit. After comparing the identification information and optionally downloading and saving the second application part as well as saving the received identification information, the operating unit executes the operating application so that access between the first and second application parts takes place across the given software interface.

In an advantageous embodiment, a first address is assigned to the module-side communication interface of the module, and a second address which is different from the first address is assigned to the second communication interface of the operating unit, and the operating unit controls a communication between a module connected to the first communication interface and a separate operating device connected to the second communication interface, such that data telegrams addressed to the first address and received by the operating unit from a separate operating device connected to the second communication interface are forwarded to the module.

On receiving a data telegram addressed to the first address from the separate operating device and with simultaneous communication between the operating unit and the module, the forwarding of the data telegram received by the separate operating device to the module is delayed advantageously until the communication between the operating unit and the module is concluded. Accordingly, with simultaneous communication between a separate operating device and a module, a communication between the operating device and module initiated by the operating device is delayed until the communication between the separate operating device and module is concluded.

BRIEF DESCRIPTION OF THE DRAWINGS

The present invention will now be described in greater detail below as an example on the basis of preferred embodiments and with reference to the accompanying drawings. The same reference numerals in the drawings denote the same or similar parts.

DETAILED DESCRIPTION

Figure 1:
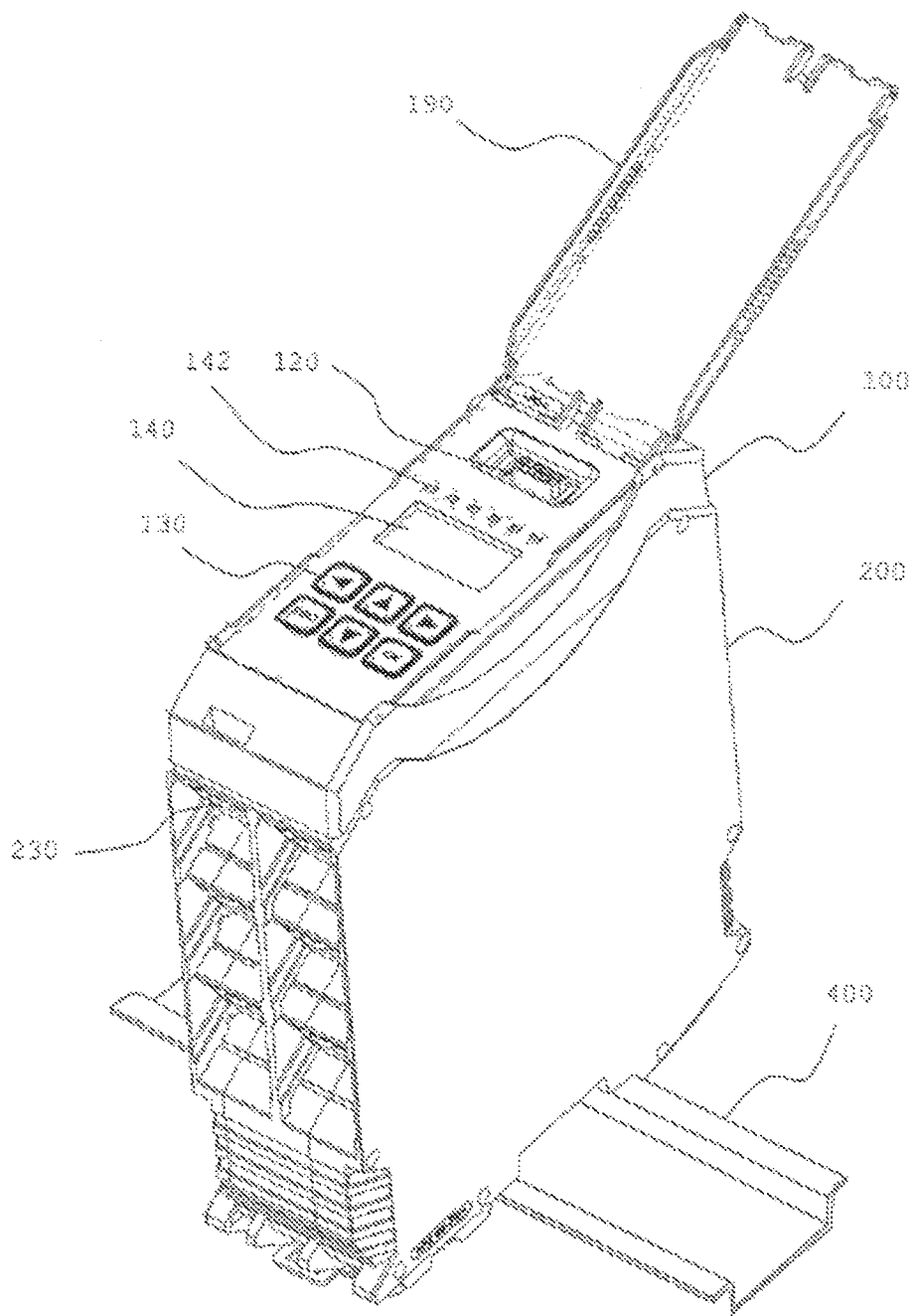
FIG. 1 shows a schematic diagram of a preferred embodiment of an operating unit according to the invention which is locked onto a module.

FIG. 1 shows a module 200 of automation technology, which comprises analog signal input 230 and is designed, for example, as a sensor, an actuator or a monitoring module. An operating unit 100 according to the invention is locked onto the module 200, such that the operating unit 100 is detachably connected to the module 200 by this locking. In the exemplary embodiment shown here, the module 200 is designed for mounting on a top-hat rail 400.

In the embodiment shown here, the operating unit 100 comprises input means in a form of pushbuttons 130 as well as output means in the form of a display 140 and LEDs 142. Furthermore, a hinge-connected cover 190 is provided to protect the input and output means. An operating application, which is designed to supply a graphical user interface via the input and output means is stored in the operating unit 100, so that in execution of the operating application, a menu with functions that can be selected by a user is displayed on the display 140, such that the selection is made by means of the pushbuttons 130.

The operating unit 100 comprises a first communication interface 110, which is connected to the module-side communication interface 210 in the locked state illustrated here, so that communication between the module 200 and the operating unit 100 is made possible. The module-side communication interface 210 is arranged on the top side of the module 200 in the embodiment shown here, and the communication interface 110 of the operating unit 100 is arranged on the bottom side of the same. The interfaces 110 and 210 are not visible in FIG. 1 accordingly.

The operating unit 100 also has a second communication interface 120 for connecting a separate operating device designed as a PC, for example.

Figure 2:
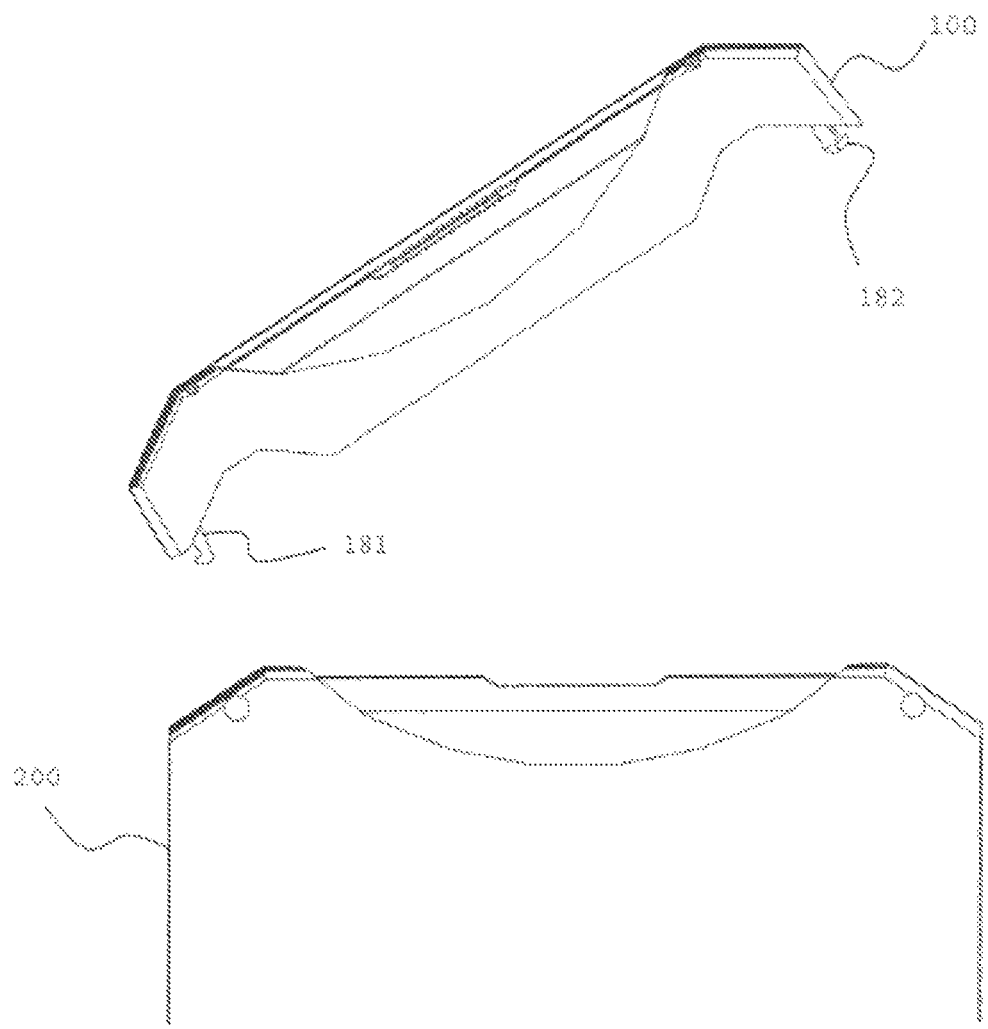
FIG. 2 shows schematically the operating unit depicted in FIG. 1 in the unlocked state.

FIG. 2 shows the operating unit 100 and the module 200 in the unlocked state. Locking of the operating unit 100 onto the module 200 takes place by means of locking elements 181 and 182, which lock with the respective locking elements of the module 200 in the locked state. At least one of the locking elements 181, 182 or a locking element on the module 200 is arranged to be movable in such a way that unlocking is made possible by manual operation.

Figure 3:
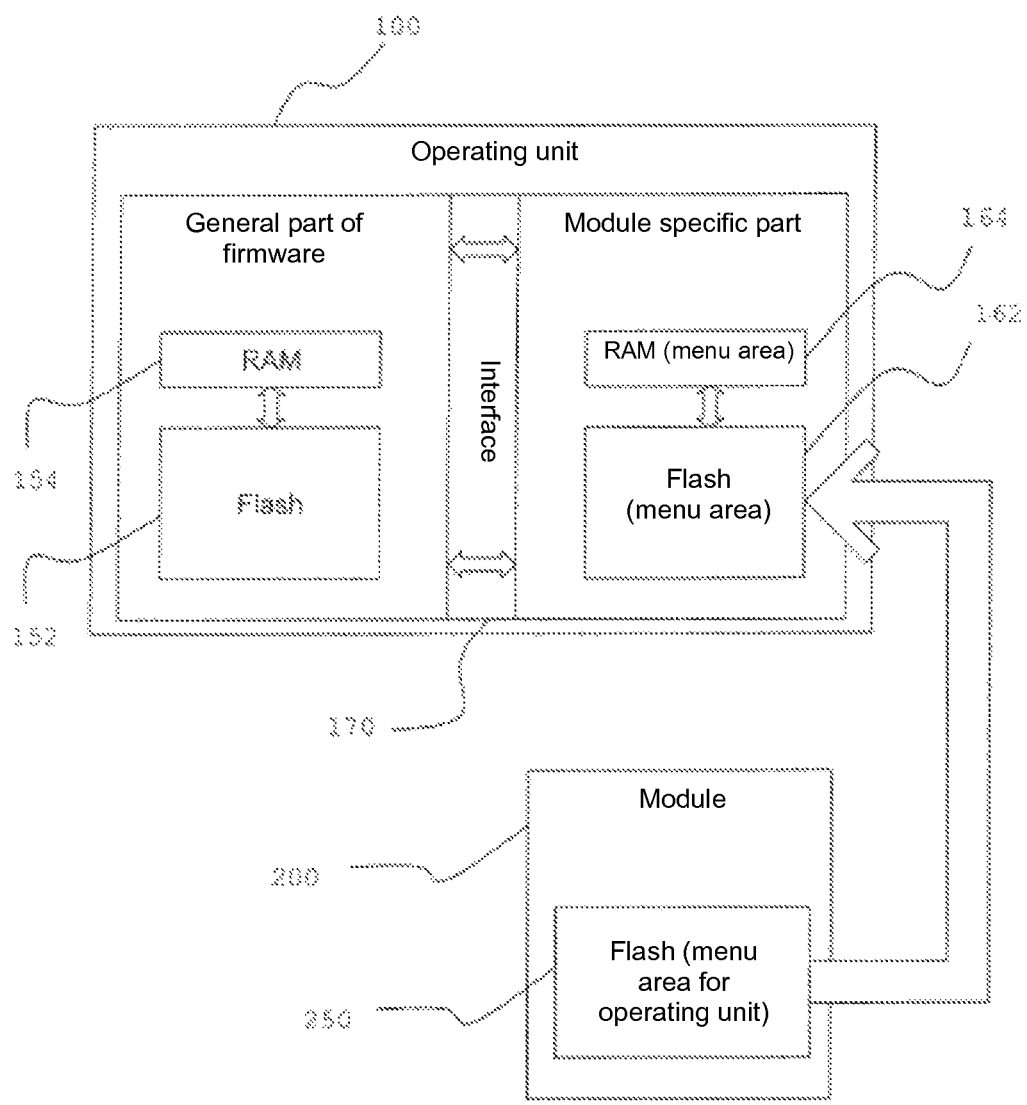
FIG. 3 shows schematically the self-programming operation of a preferred embodiment of an operating unit according to the invention.

FIG. 3 shows schematically the memory structure of a preferred embodiment of an operating unit 100 and a module 200 connected thereto. The exemplary embodiment here shows schematically the self-programming process, which is controlled by a microcontroller in the operating unit 100. Each type of module is to be differentiated by an unambiguous identification number (ID). The operating unit stores the ID of the module to which the menu area currently loaded belongs. This menu area comprises the module-specific menu structure and the module-specific functions, which can be retrieved from the menu.

After being activated, the operating unit 100 first reads out the ID of the connected module 200 and compares it with the ID belonging to the menu area currently loaded. If these two IDs are different, the operating unit 100 is connected to a module of a different type and the operating unit 100 begins to load the menu area belonging to this module 200 in the form of executable hex code from the memory 250 of the connected module 200 and begins to program itself with this code during operation. The actual firmware is stored in the memory area 152 of the flash memory of the microcontroller and uses the memory area 154 of the RAM memory of the microcontroller.

A fixed area 162 in the flash memory of the microcontroller of the operating unit 100 is reserved for the menu area. For static variables of the menu area, a fixed area 164 is also reserved in the RAM of the microcontroller.

To be able to access functions and/or variables inside of the menu area from program code outside of the menu area as well as to be able to access functions and/or variables outside of the menu area from functions of the menu area, a defined interface 170 is provided between these two areas. It is possible in this way to adjust the menu area specifically for each module without having to make changes in the actual firmware of the operating unit, which is stored in the memory area 152 of the flash memory of the microcontroller.

For the use of an operating unit 100 in the embodiment shown here, this area must be stored as hex code in the memory of the respective module, so that each operating unit can load it from the module and thus can be operated together with the module.

Figure 4:
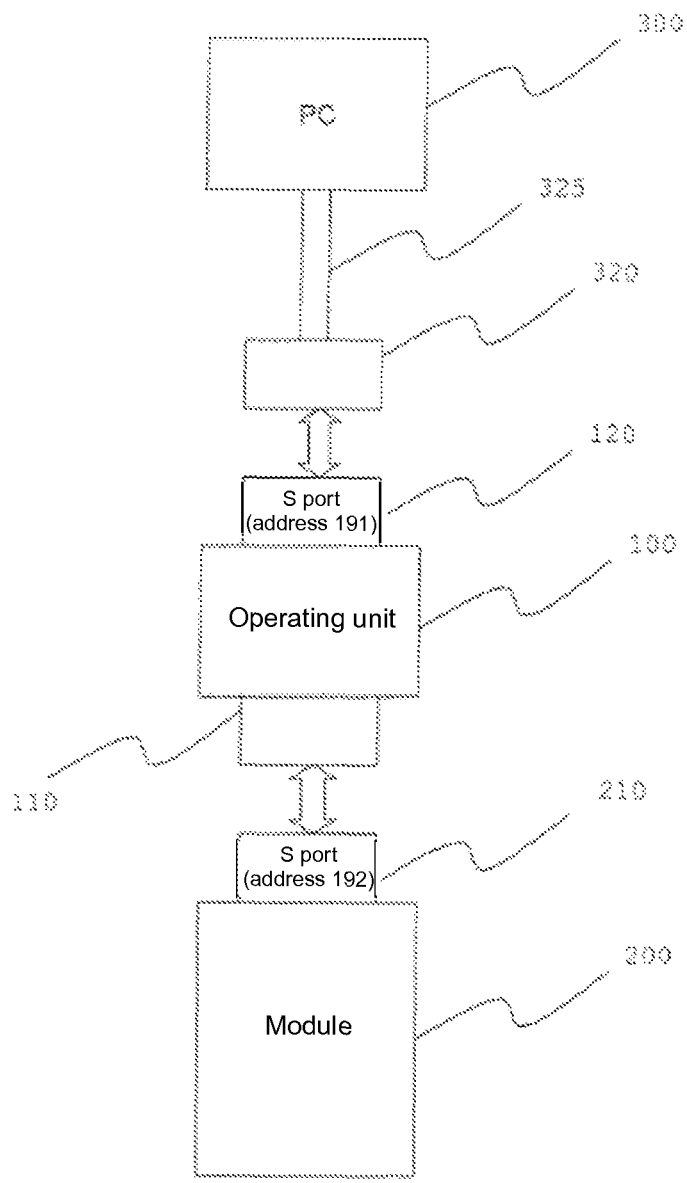
FIG. 4 shows schematically a preferred embodiment of an operating unit according to the invention, which is connected to a module and a PC of a separate operating device.

In the exemplary embodiment shown in FIG. 4, a PC 300 is connected to an operating unit 100 and the latter is connected to a module 200. The interfaces 110, 210, 120 and 320 are preferably designed as serial interfaces for a serial data transmission. Accordingly the interface 210 of the module 200 and the second interface 120 of the operating unit 100 are preferably embodied as 12-pole sockets, and the first interface 110 of the operating unit 100 and the interface 320 of PC 300 are preferably designed as 12-pole connectors, so that the interface 320 in the embodiment shown here together with the cable 325 forms a multi-pole connecting cable.

To implement communication between the operating unit 100 and the module 200 and also between the PC 300 and the module 200, the operating unit 100 has a master protocol stack and also a slave protocol stack. The operating unit 100 behaves like a connected slave with respect to the PC 300 and forms a connected master with respect to the module 200.

In the embodiment shown here, the communication interface 210 of the module 200, the interface being designed as a serial port, has the address 192 in the protocol, but the frontside serial port 120 of the operating unit 100 has the address 191. Then in the slave stack of the operating unit 100, there is a first check of the address of the incoming telegram. If the address is 191, the telegram is processed in the slave stack of the operating unit 100. It is thus possible to communicate directly from the separate operating unit 300, which is designed as a PC, with the operating unit 100 in order to read and/or write parameters, for example. If the address is 192, the telegram is forwarded to the master stack of the operating unit 100 and sent to the connected module 200. The response of the module 200 is then forwarded to the PC 300.

Communication between the operating unit 100 and the module 200 may also take place in parallel, so the slave stack of the operating unit—as soon as the PC 300 wants to communicate with the module 200—must wait with the transfer of the telegram to the master stack until the current data transfer between the operating unit 100 and the module 200 is concluded. If the firmware of the operating unit 100 wants to communicate with the module 200 and if a data transfer is taking place between the PC 300 and the module 200, then the operating unit must also wait until the current communication between the PC 300 and the module 200 is finished before it can start the data transfer.

What is claimed is:

1. An operating unit for operating a module designed in particular as a device in an automation system and having a module-side communication interface, the operating unit comprising:
   fastening means for detachably fastening the operating unit to the module, wherein the fastening means are designed for fastening the operating unit onto modules of different types of modules;
   input means and output means for input and output of information, respectively;
   a first communication interface, which is connected to the module-side communication interface when the operating unit is connected and is designed for data exchange between the operating unit and the module, wherein the operating unit is designed to receive and store identification information which identifies a type of module from a module connected to the first communication interface (110);
   at least one memory for storing an operating application, such that the memory comprises a first memory area for storing a first application part and a second memory area for storing a second application part, such that accesses between the application parts take place across a predefined interface, and such that the operating unit is designed to load the second application part from a connected module, wherein the operating unit is designed to receive the identification information from the connected module before downloading the second application part and to compare this information with the identification information stored last and to load the second application part from the connected module and save the received identification information only if the received identification information and the most recently stored identification information are different; and
   a second communication interface for communication with a separate operating device.

2. The operating unit according to claim 1, wherein the module is designed as a device of the measurement, control and regulating technology or as a converter for the measurement, control and regulating technology.

3. The operating unit according to claim 1, designed for control of a communication between the module that is connected to the first communication interface and a separate operating device that is connected to the second communication interface.

4. The operating unit according to claim 3, wherein a first address is assigned to the module-side communication interface of the connected module, and a second address, which is different from the first address, is assigned to the second communication interface of the operating unit, and wherein the operating unit is designed to relay data telegrams which include the first address and are received from the separate operating device to the module.

5. The operating unit according to claim 4, comprising a master protocol stack for communication with the module and a slave protocol stack for communication with the separate operating device.

6. The operating unit according to claim 1, wherein the memory comprises a RAM memory and/or a flash memory.

7. The operating unit according to claim 1, wherein the operation of the module comprises the display and/or alteration of parameterization data and/or configuration data and/or the display of process values.

8. The operating unit according to claim 1, wherein the first communication interface and/or the second communication interface is/are designed for a serial data transmission.

9. A method for operating a module designed in particular as a device in an automation system and having a module-side communication interface, wherein an operating unit is attached to the module so that the first communication interface of the operating unit is connected to the module-side communication interface, and wherein a user interface is supplied by means of an operating application stored in a memory of the operating unit, the method comprising:
  reading out, by the operating unit, identification information that identifies a module type from the module;
  comparing, by the operating unit, the received identification information with identification information stored at a predefined memory location in the operating unit;
  when the received identification information differs from the stored identification information,
    i) downloading a second application part from the module by the operating unit and saving the downloaded second application part in a second memory area of the operating unit, such that the second application part and a first application part stored in a first memory area of the operating unit form the operating application, and
    ii) storing the received identification information at the predetermined memory location in the operating unit; and
  executing the operating application, by the operating unit, so that accesses between the first and second application part take place across a predefined software interface.

10. The method according to claim 9, wherein
a first address is assigned to the module-side communication interface of the module and a second address, which is different from the first address, is assigned to the second communication interface of the operating unit, and wherein the method further comprises:
  controlling, by the operating unit, a communication between a module connected to the first communication interface and a separate operating device connected to the second communication interface, such that data telegrams, which are addressed to the first address and are received by the operating unit from a separate operating device connected to the second communication interface are relayed to the module.

11. The method according to claim 10, wherein when a data telegram addressed to the first address is received by the separate operating device and at the same time there is communication between the operating unit and the module, the data telegram received by the separate operating device is relayed to the module with a delay until the communication between the operating unit and the module is concluded, and wherein when there is simultaneous communication between the separate operating device and the module, a communication initiated by the operating unit between the operating unit and the module is delayed until the communication between the separate operating device and the module is concluded.

* * * * *